(12) United States Patent
Mouttet

(10) Patent No.: US 7,564,262 B2
(45) Date of Patent: Jul. 21, 2009

(54) CROSSBAR COMPARATOR

(76) Inventor: Blaise Laurent Mouttet, 4201 Wilson Blvd., #110-364, Arlington, VA (US) 22203

( * ) Notice: Subject to any disclaimer, the term of this patent is extended or adjusted under 35 U.S.C. 154(b) by 153 days.

(21) Appl. No.: 11/976,925

(22) Filed: Oct. 30, 2007

(65) Prior Publication Data

US 2008/0222342 A1    Sep. 11, 2008

Related U.S. Application Data

(63) Continuation-in-part of application No. 11/790,496, filed on Apr. 26, 2007, now Pat. No. 7,459,933, which is a continuation of application No. 11/395,237, filed on Apr. 3, 2006, now Pat. No. 7,302,513.

(51) Int. Cl.
*H03K 19/177* (2006.01)
*H01L 25/00* (2006.01)

(52) U.S. Cl. ............................. 326/41; 326/39; 326/47

(58) Field of Classification Search .................. 326/38, 326/39, 41, 47; 977/708, 767
See application file for complete search history.

(56) References Cited

U.S. PATENT DOCUMENTS

| | | | |
|---|---|---|---|
| 5,272,359 A | 12/1993 | Nagasubramanian et al. | |
| 5,912,839 A | 6/1999 | Ovshinsky et al. | |
| 6,128,214 A | 10/2000 | Kuekes et al. | |
| 6,256,767 B1 * | 7/2001 | Kuekes et al. | 716/9 |
| 6,531,371 B2 | 3/2003 | Hsu et al. | |
| 6,574,130 B2 | 6/2003 | Segal et al. | |
| 6,867,996 B2 | 3/2005 | Campbell et al. | |
| 6,940,744 B2 | 9/2005 | Rinerson et al. | |
| 7,274,208 B2 * | 9/2007 | DeHon et al. | 326/38 |
| 7,310,004 B2 * | 12/2007 | DeHon | 326/41 |
| 7,489,583 B2 | 2/2009 | Kuekes et al. | |

OTHER PUBLICATIONS

Mouttet, Nanomaterials and Morphware, Nanotechnology Law & Business, Jun. 2007, pp. 149-156.

* cited by examiner

*Primary Examiner*—Daniel D Chang

(57) ABSTRACT

A device includes a first crossbar array having first input columns and first output rows, wherein a plurality of the rows of the first crossbar array are configured to store first stored data in the form of high or low resistance states, and a second crossbar array having second input columns and second output rows, wherein a plurality of the rows of the second crossbar array are configured to store second stored data in the form of high or low resistance states. The second stored data is a complement of the first stored data and the first output rows are electrically connected to the second output rows. The device provides for data storage and comparison for computer processing, audio/speech recognition, and robotics applications.

19 Claims, 2 Drawing Sheets

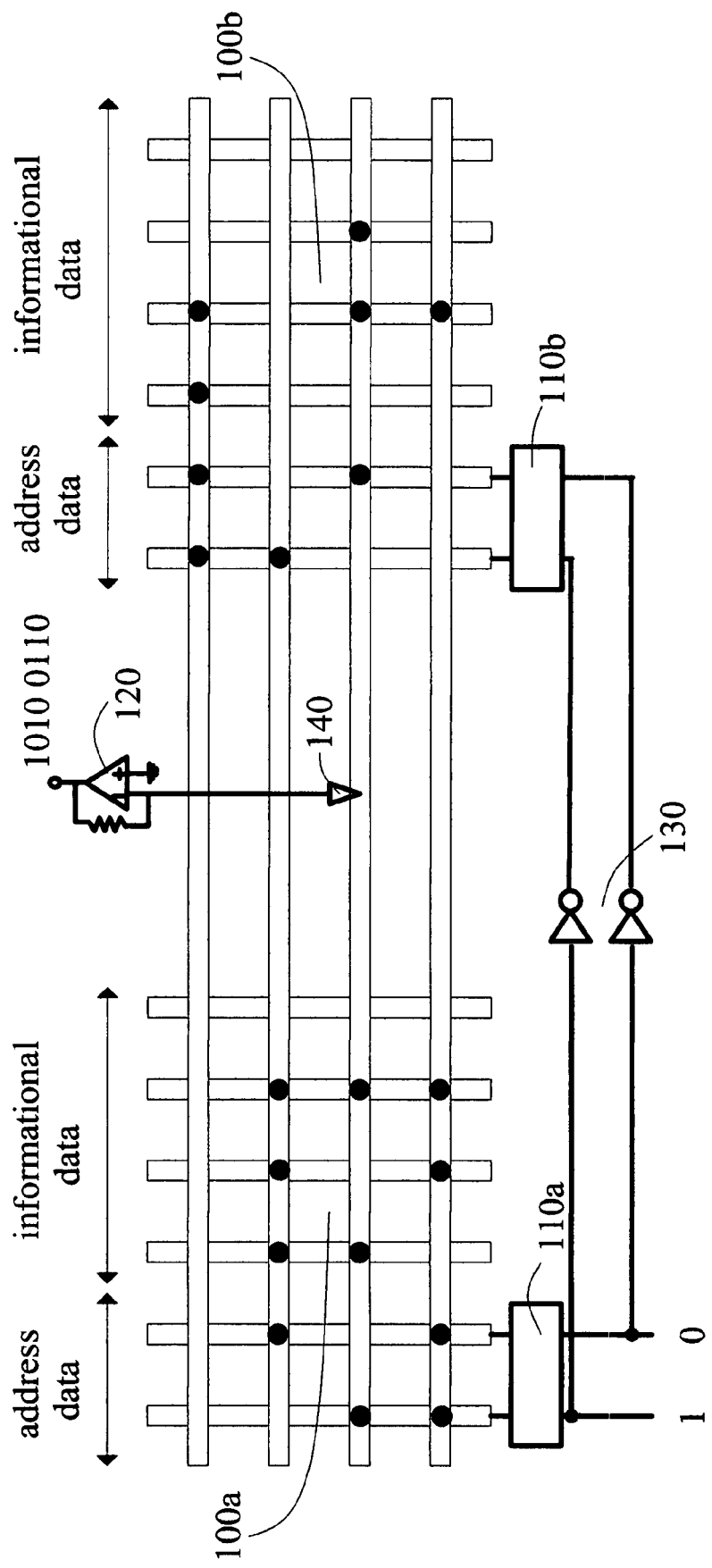

CROSSBAR COMPARATOR

This patent application is a Continuation-In-Part of U.S. patent application Ser. No. 11/790,496, filed on Apr. 26, 2007 now U.S. Pat. No. 7,459,933 which is a Continuation of U.S. patent application Ser. No. 11/395,237, filed on Apr. 3, 2006 now U.S. Pat. No. 7,302,513.

FIELD OF THE INVENTION

The present invention pertains to a programmable comparator circuit for a variety of applications including computer processing, audio/speech recognition, and robotics.

BACKGROUND OF THE INVENTION

As disclosed in parent U.S. patent application Ser. Nos. 11/790,496 and 11/395,237, which are incorporated by reference in their entirety, crossbar circuit architectures may provide for storage of data used in image and pattern processing. The present patent application provides further embodiments of such systems.

BRIEF DESCRIPTION OF THE DRAWINGS

FIG. 2 illustrates an example of a crossbar comparator circuit for a second embodiment of the present invention.

DETAILED DESCRIPTION

Figure 1:
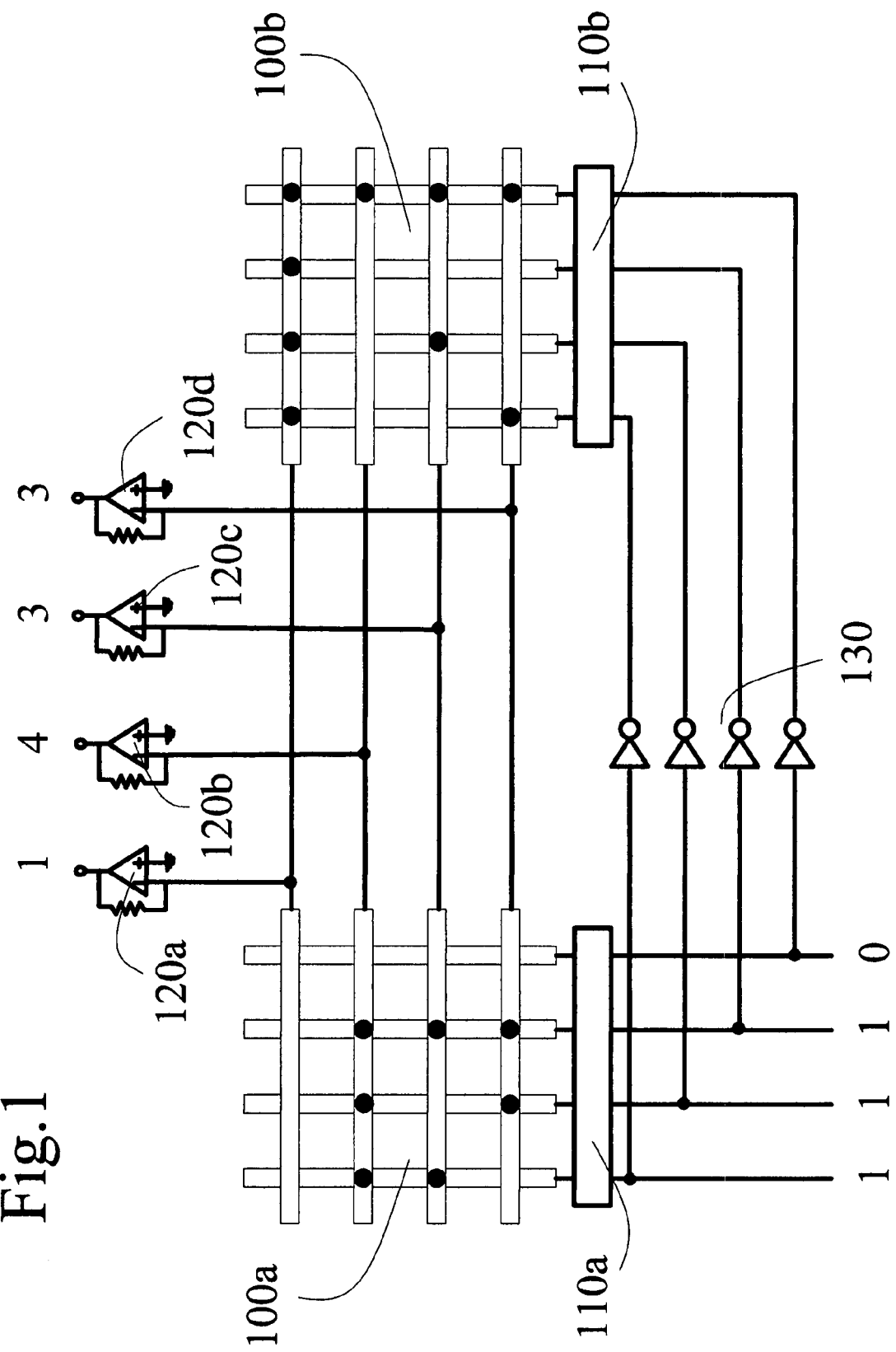
FIG. 1 illustrates an example of a crossbar comparator circuit for a first embodiment of the present invention.

FIG. 1 illustrates a first crossbar array 100a and a second crossbar array 100b. Each crossbar array includes intersecting arrays of wires in which the intersections (i.e. crosspoints) between the wires are set to a relatively high or low resistance state. Either a mechanical switch or a molecular or thin film material is included between the wires capable of switching between resistance states. Such crossbar arrays and associated resistance switching materials are described in prior art such as Nagasubramanian et al. U.S. Pat. No. 5,272,359, Kuekes et al. U.S. Pat. No. 6,128,214, Hsu et al. U.S. Pat. No. 6,531,371, Segal et al. U.S. Pat. No. 6,574,130, and Campbell U.S. Pat. No. 6,867,996 as well as U.S. patent application Ser. Nos. 11/395,237 and 11/395,232, each or which is incorporated by reference in their entirety. As discussed in the prior art, resistance switching materials include rotaxanes, TCNQ, chalcogenides, perovskites, and a variety of other materials, each of which is contemplated for embodiments of the present invention. Carbon nanotubes and carbon nanotube ribbons, as taught by Segal et al. U.S. Pat. No. 6,574,130 and other related patents assigned to Nantero, may also be used to form the crossbar arrays without the use of a thin film or molecular material. Either nanoscale wires (nanowires) or microscale wires may be used to form the crossbar arrays with nanoscale wires having the advantage of higher potential circuit densities and microscale wires having the advantage of ease of fabrication with reduced defects. In order to prevent feedback paths the input wires of the crossbar an arrays may be doped with a p-type material and the output wires of the crossbar arrays may be doped with n-type material or, alternatively, a rectification layer may be provided between the wire arrays forming the crossbars.

The crossbar arrays 100a, 100b store data in terms of high or low resistance states in the intersecting crosspoints of the respective crossbar arrays. In FIGS. 1 and 2 dark circles represents crosspoints programmed with a low resistance state while unmarked crosspoints have a high resistance state. The low resistance states may be interpreted as a logic 1 (allowing current flow) while the high resistance states may be interpreted as a logic 0 (limiting current flow). Various programming circuits and programming techniques exist for resistance crosspoint architectures such as disclosed in the parent applications and prior art such as Rinerson et al. U.S. Pat. No. 6,940,744 and Ovshinsky et al. U.S. Pat. No. 5,912,839 which may be used in combination with the present invention.

The input voltages to the dual crossbars 100a, 100b as illustrated in FIG. 1 are in the form of high or low voltage levels represented by respective logic levels 1 and 0. For example logic 1 may be on the order of 3-5 V while logic 0 may be less than 1 V. Inverter circuitry 130 inverts the voltage levels to be input to crossbar array 100b. Voltage conversion circuitry 110a and 110b may be used to convert the input voltages from logic voltage levels to voltage levels appropriate for programming the resistance states of the crossbar (determined based on the type and material of crossbar used) or to convert from logic voltage levels to voltage levels low enough to avoid changing the resistance state when a comparison operation is desired between input voltage bit patterns and previously programmed resistance patterns in the crossbar array rows. The respective rows of the two crossbar arrays 100a, 100b are connected either by a direct electrical connection, such as by sharing a common wire, or by an indirect electrical connection, such as each being connected to a common intermediate electrode or wiring path.

Operational amplifier circuitry 120a, 120b, 120c, 120d is provided to act as a summing amplifier for each of the row outputs. The feedback resistance of each of the op-amps is set to the average low resistance state of the crosspoints in the respective crossbar rows. The crosspoints in crossbar array 100b are set to resistance states that are complementary to the crosspoints in crossbar array 100a. This means that each crosspoint in crossbar array 100a having a low resistance state has a corresponding crosspoint in crossbar array 100b having a high resistance state and each crosspoint in crossbar array 100a having a high resistance state has a corresponding crosspoint in crossbar array 100b having a low resistance state. The result of this configuration is that each op-amp acts as summing amplifier for the corresponding crossbar rows producing an analog voltage output that is a function of the similarity between the input voltage state and the stored resistance states. In the example of FIG. 1, the first row of crosspoints in crossbar array 100a are all set to high resistance states while the first row of crosspoints in crossbar array 100b are all set to low resistance states. For the illustrated input pattern of 1 1 1 0 only one of the crosspoints will pass current (the fourth column of the first row of 100b which has corresponding inverted input 0 0 0 1). However, the resistance states of the crosspoints in the second row of crossbar array 100a correspond to the input pattern. The first three crosspoints of the second row of 100a are at low resistance states allowing current flow while the fourth crosspoint of the second row of 100b is at a low resistance state allowing current flow based on the inverted input 0 0 0 1. Thus four crosspoints pass current and the magnitude of the voltage output of op-amp 120b is four times the input voltage level.

One possible application of a crossbar comparator as described includes speech and audio processing systems. Digital patterns representing a variety of sound or speech patterns may be stored in a plurality of rows of complementary crossbar arrays as resistance states by setting voltage conversion circuitry 110a, 110b to a programming setting and sequentially selecting rows of the crossbars to be set to particular values based on the input voltages. At a later point in time the voltage conversion circuitry 110a, 110b can be set to a lower level that avoids modifying the resistance states and newly detected digital sound patterns may be detected and compared to the resistance patterns stored in the rows of the crossbar arrays. The degree of matching between the sensed and stored audio patterns would be related to the analog output level from op-amp circuits 120a-120d. The analog outputs from each op-amp circuit 120a-120d may be compared to a predetermined threshold which determines whether to actuate one or a variety of actions or devices. This may be applied to voice automated control systems wherein a vocabulary of digital patterns corresponding to vocal patterns are stored in a plurality of the crossbar rows so as to activate one or more action such as turning on and off an electronic device (television, mobile phone, music player, computer, etc.) or changing parameters of such devices (volume, channel, settings, etc.) Programming and reprogramming of the stored resistance patterns may be performed as necessary to customize the recognizable sound patterns to digital patterns from different users with intermediate clearing steps used to reset all the crosspoints to high resistance states. Using larger crossbar arrays or multiple crossbar arrays in the comparator configurations as taught may provide storage of a larger number of binary resistance patterns corresponding to basic phonetic sounds for applications in speech recognition based word processing in computer or portable electronic devices.

Another possible application of a crossbar comparator is in robotics. The input bit patterns to the dual crossbars may correspond to sensor inputs based on tactile, motion, light, temperature, or a variety of other detectors used individually or in combination. The analog outputs from each of the op-amps may be connected to a comparator circuit used to drive a variety of actuators or motors based on whether the analog output is sufficiently large relative to a predetermined threshold. These actuators/motors may provide for robotic motion if the sensed pattern of motion, light, temperature, or other parameter is a sufficiently close match to stored resistance patterns in the dual crossbars.

The dual crossbar configuration is of course not limited to a 4×4 configuration as in FIG. 1 but may take a variety of forms using 2×2, 3×3, . . . , 100×100 crossbars or greater or with crossbars with unequal numbers of rows and columns. While specific circuitry such as inverters and op-amps are used in the exemplary embodiment these functions may be performed by similar analog and digital circuits or by software of a general purpose microprocessor.

FIG. 2 illustrates possible modifications of the crossbar array comparator in which only a few of the columns of the dual crossbars 100a, 100b are subject to comparison. This is useful for addressing operations of crossbar memory systems in which address data is used for the comparison to retrieve informational data. In the example of FIG. 2 the input 1 0 provides a data readout of the resistance states for the third row of 1 0 1 0 (from crossbar 100a) and 0 1 1 0 (from crossbar 100b).

Another useful modification illustrated in FIG. 2 is the use of a scanning probe tip 140 to provide the electrical connection of the crossbar row outputs to op-amp Circuit 120. This avoids the need for multiple op-amp circuits and provides an interface between nanowire crossbars and microelectronic circuitry as explained in the parent patent applications.

As described above many modifications of the present invention are possible and many applications are possible. The present invention is only limited by the following claims.

I claim:
1. A device including:
    a first crossbar array having first input columns and first output rows wherein a plurality of the rows of the first crossbar array are configured to store first stored data in the form of high or low resistance states;
    a second crossbar array having second input columns and second output rows wherein a plurality of the rows of the second crossbar array are configured to store second stored data in the form of high or low resistance states; and
    a summing amplifier electrically connected to one of the first and second output rows,
    wherein multiple columns of the second stored data have complementary values to multiple columns of the first stored data and the first output rows are electrically connected to the second output rows.
2. The device of claim 1 wherein the summing amplifier is an operational amplifier circuit including a feedback resistance.
3. The device of claim 1 wherein voltage conversion circuitry is provided connected to the second input columns and the first input columns.
4. The device of claim 1 wherein inverter circuitry is provided between inputs to the first crossbar array and inputs to the second crossbar array.
5. The device of claim 1 wherein a scanning probe device is provided to scan the output rows and electrically connect one of the rows to an operational amplifier circuit configured as the summing amplifier.
6. The device of claim 1 wherein the first and second crossbar arrays are nanowire crossbar arrays.
7. The device of claim 1 wherein the first and second crossbar arrays are carbon nanotube crossbar arrays.
8. The device of claim 1 wherein the first and second crossbar arrays include TCNQ, chalcogenide, or perovskite material as resistance variable material.
9. The device of claim 1 wherein the first and second stored data is audio data.
10. The device of claim 1 wherein the first and second stored data is address data.
11. A process including:
    a step of storing first stored data in the form of high or low resistance states in a first crossbar array having first input columns and first output rows;
    a step of storing second stored data in the form of high or low resistance states in a second crossbar array having second input columns and second output rows; and
    a step of summing the stored data in the first and second output rows with a summing amplifier electrically connected to one of the first and second output rows,
    wherein multiple columns of the second stored data have complementary values to multiple columns of the first stored data and the first output rows are electrically connected to the second output rows.
12. The process of claim 11 including a step of converting voltages prior to application to the first and second input columns.
13. The process of claim 11 including a step of inverting voltages input to the second crossbar array relative to the first crossbar array.
14. The process of claim 11 including a step of scanning a scanning probe device across the output rows.
15. The process of claim 11 wherein the first and second crossbar arrays are nanowire crossbar arrays.
16. The process of claim 11 wherein the first and second crossbar arrays are carbon nanotube crossbar arrays.

17. The process of claim 11 wherein the first and second stored data is audio data.

18. The process of claim 11 wherein the first and second stored data is address data.

19. A device including:
   a first plurality of crossbar columns storing first stored data in the form of high or low resistance states;
   a second plurality of crossbar columns storing second stored data in the form of high or low resistance states; and
   a summing amplifier electrically connected to an output row associated with one of the first or second plurality of crossbar columns,
   wherein the second stored data stored in the second plurality of crossbar columns have complementary values to the first stored data stored in the first plurality of crossbar columns.

* * * * *